(12) United States Patent
Ovrutsky et al.

(10) Patent No.: US 10,818,550 B2
(45) Date of Patent: Oct. 27, 2020

(54) METHODS FOR SINGULATION AND PACKAGING

(71) Applicant: FLIR SYSTEMS, INC., Wilsonville, OR (US)

(72) Inventors: David Ovrutsky, Charlotte, NC (US); Hagit Gershtenman-Avsian, Charlotte, NC (US); Alexander Feldman, Los Altos, CA (US); Andrey Grinman, Charlotte, NC (US)

(73) Assignee: FLIR SYSTEMS, INC., Wilsonville, OR (US)

( * ) Notice: Subject to any disclaimer, the term of this patent is extended or adjusted under 35 U.S.C. 154(b) by 0 days.

(21) Appl. No.: 16/096,441

(22) PCT Filed: Apr. 28, 2017

(86) PCT No.: PCT/US2017/030215
§ 371 (c)(1),
(2) Date: Oct. 25, 2018

(87) PCT Pub. No.: WO2017/190060
PCT Pub. Date: Nov. 2, 2017

(65) Prior Publication Data
US 2019/0148232 A1    May 16, 2019

Related U.S. Application Data

(60) Provisional application No. 62/329,584, filed on Apr. 29, 2016.

(51) Int. Cl.
*H01L 23/48* (2006.01)
*H01L 21/78* (2006.01)
*H01L 21/50* (2006.01)
*H01L 23/00* (2006.01)
*B23K 26/364* (2014.01)
*H01L 21/683* (2006.01)
*H01L 23/04* (2006.01)

(52) U.S. Cl.
CPC ............ *H01L 21/78* (2013.01); *B23K 26/364* (2015.10); *H01L 21/50* (2013.01); *H01L 21/6836* (2013.01); *H01L 23/04* (2013.01); *H01L 24/09* (2013.01); *H01L 24/94* (2013.01); *H01L 2924/16235* (2013.01)

(58) Field of Classification Search
CPC ...... H01L 21/78; H01L 21/50; H01L 21/6836
See application file for complete search history.

(56) References Cited

U.S. PATENT DOCUMENTS 9,165,832 B1    10/2015  Papanu et al.
2006/0088980 A1  4/2006  Chen et al.
(Continued)

OTHER PUBLICATIONS

International Search Report dated Sep. 8, 2017 for PCT/2017/030215 filed Apr. 28, 2017.

*Primary Examiner* — Phuc T Dang
(74) *Attorney, Agent, or Firm* — Haynes and Boone, LLP (57) ABSTRACT

A method of singulating includes scribing a first scribe line on a first side of a substrate, scribing a second scribe line on a second side of the substrate, the first and second sides facing away from each other, the second scribe line being substantially parallel to the first scribe line, and simultaneously separating the substrate at the first scribe line and the second scribe line.

20 Claims, 13 Drawing Sheets

(56) References Cited

U.S. PATENT DOCUMENTS

| | | | |
|---|---|---|---|
| 2006/0126200 A1* | 6/2006 | Nishio | C03B 33/023 |
| | | | 359/883 |
| 2007/0190691 A1 | 8/2007 | Humpston et al. | |
| 2007/0278657 A1* | 12/2007 | Lee | H01L 21/76898 |
| | | | 257/692 |
| 2008/0122560 A1* | 5/2008 | Liu | B81B 7/0077 |
| | | | 333/247 |
| 2011/0175204 A1* | 7/2011 | Sawada | H01L 21/6836 |
| | | | 257/618 |
| 2011/0244657 A1 | 10/2011 | Grivna et al. | |
| 2014/0045287 A1* | 2/2014 | Kira | G02F 1/133351 |
| | | | 438/30 |
| 2015/0001741 A1 | 1/2015 | Lee et al. | |
| 2015/0028446 A1 | 1/2015 | Lei et al. | |
| 2015/0270173 A1 | 9/2015 | Grivna | |
| 2015/0279739 A1* | 10/2015 | Lei | H01L 21/78 |
| | | | 438/462 |
| 2016/0071770 A1 | 3/2016 | Albermann et al. | |
| 2016/0163916 A1* | 6/2016 | Ilievski | H01L 33/007 |
| | | | 438/33 |

\* cited by examiner

METHODS FOR SINGULATION AND PACKAGING

CROSS-REFERENCE TO RELATED APPLICATION

This application is the U.S. national phase application based on PCT/US2017/030215 filed on Apr. 28, 2017, which claims priority to U.S. Provisional Application No. 62/329,584, filed in the U.S. Patent and Trademark Office on Apr. 29, 2016, and entitled "Methods for Singulation and Packaging," which is incorporated by reference herein in its entirety and for all purposes.

BACKGROUND

1. Field

Example embodiments relate to methods for singulation and packaging.

2. Description of the Related Art

Device manufacturing processes, e.g., semiconductor device manufacturing, MEMS (microelectromechanical systems) device manufacturing, optical device manufacturing, etc., may fabricate a plurality of devices on a wafer or mother substrate, after which the wafer or mother substrate may be singulated into units and packaged. Singulation and packaging may be performed in a number of ways, and singulation and packaging may include overlapping or interleaved operations, rather than being purely sequential.

SUMMARY

Embodiments are directed to a method of singulating, including scribing a first scribe line on a first side of a substrate, scribing a second scribe line on a second side of the substrate, the first and second sides facing away from each other, the second scribe line being substantially parallel to the first scribe line, and simultaneously separating the substrate at the first scribe line and the second scribe line.

Scribing may use a laser irradiated on the substrate in a stealth dicing operation.

The substrate may include first and second substrates in a stacked arrangement, the first scribe line being formed in the first substrate, and the second scribe line being formed in the second substrate.

The first and second scribe lines may be offset from one another.

The first scribe line may not separate the second substrate.

The second scribe line may not separate the first substrate.

The method may further include scribing a third scribe line on the second side of the substrate, the third scribe line being substantially parallel to the first scribe line, the second and third scribe lines being spaced apart. The second and third scribe lines may form edges of a portion of the second substrate that is not attached to the first substrate.

The first substrate may include at least one circuit structure, and the second substrate may form a lid for the at least one circuit structure.

The method may further include attaching a dicing tape to the first wafer, the dicing tape being expanded after the second scribe line is formed. Embodiments are also directed to a device fabricated from a substrate having a plurality of devices and singulated according to the method according to an embodiment. The device may include a circuit die section and a lid die section, and at least one side surface of the circuit die section and at least one side surface of the lid die section may have ridges extending in a longitudinal direction.

Embodiments are also directed to a method of manufacturing a device, the method including providing a first wafer having a plurality of devices, providing a second wafer having a lid pattern delineating a plurality of lids, removing portions of a surface of the second wafer corresponding to lid edges in the lid pattern using a beveled dicing blade such that the lids have at least one sidewall that is at an angle relative to the second substrate, the angle being greater than 0 and less than 90 degrees, and attaching the first and second wafers together such that the lids cover the devices.

During removal of the portions of the surface of the second wafer corresponding to the lid edges, the dicing blade may not completely penetrate the second substrate.

The method may further include scribing scribe lines along the removed portions of the surface of the second wafer.

The scribing may use a laser irradiated on the second substrate in a stealth dicing operation.

Embodiments are also directed to a device package, including a device on a substrate, the substrate having a bond pad area that includes at least one bond pad, and a lid attached to the substrate, the lid covering the device, the lid exposing the bond pad area, the lid having a sidewall extending at an angle to the substrate, the angle being greater than 0 and less than 90 degrees.

BRIEF DESCRIPTION OF THE DRAWINGS

Features will become apparent to those of skill in the art by describing in detail example embodiments with reference to the attached drawings, in which.

DETAILED DESCRIPTION

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey the scope of the example embodiments to those skilled in the art. Like reference numerals refer to like elements throughout.

According to an example embodiment, a singulation process flow uses two aligned back-to-front laser scribes with a single expansion that simultaneously singulates both lid and circuit bonded substrates of wafer level package (WLP) wafer stack.

A manufacturing process may form a plurality of sensors on a wafer. A general singulation process may include a saw dicing process to singulate a lid wafer into individual caps or lids above the sensor area. Such a process may result in significant yield loss, e.g., ~25%. For example, a dicing blade, while traveling above bond pad areas of a chip (sensor or chip having a sensor) may bombard the surface with wafer debris and lid chips, e.g., silicon debris, which may then damage electronic circuits.

A singulation process according to an embodiment will be described in connection with FIGS. 1 through 7 and the flowchart illustrated in FIG. 11.

Figure 1A:
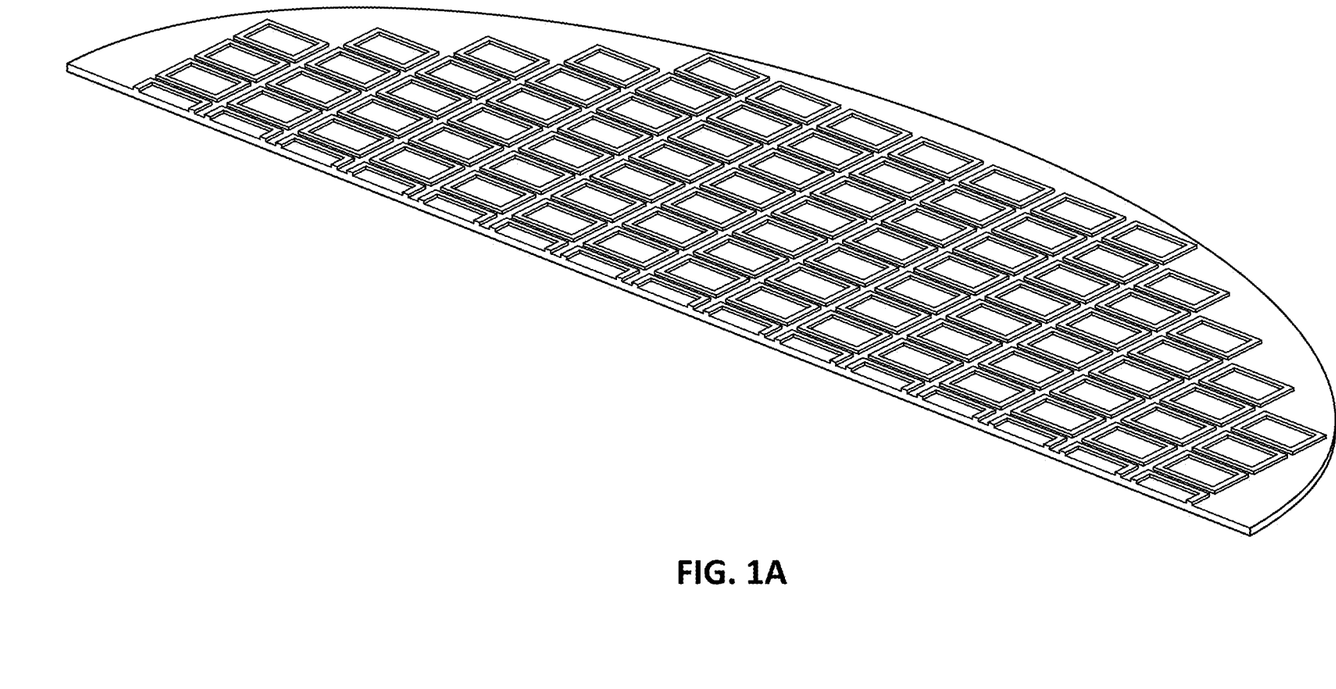
FIG. 1A illustrates a cutaway view of a lid wafer with an etched lids pattern.
Figure 1B:
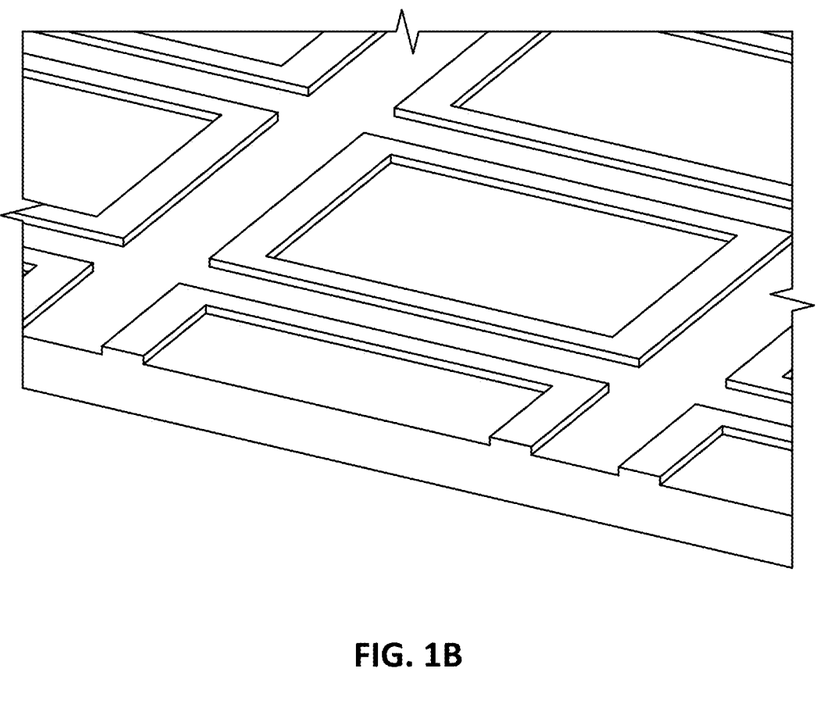
FIG. 1B illustrates a magnified portion of FIG. 1A.

FIG. 1A illustrates a cutaway view of a lid wafer with an etched lids pattern. FIG. 1B illustrates a magnified portion of FIG. 1A.

Referring to FIGS. 1A and 1B, a lid wafer may be prepared for inclusion in a WLP wafer stack. The lid wafer may have a plurality of lids (or caps) patterned therein, e.g., by etching. The etching may form recesses that will enclose a region of the circuit wafer, e.g., recesses that will cover respective sensors, circuits, etc. For example, referring to FIG. 2A, the rectangular regions on the upper surface in FIG. 2A may face inward, i.e., face the respective sensors, circuits, etc., when the lid wafer is combined with a circuit wafer in a WLP.

Figure 2A:
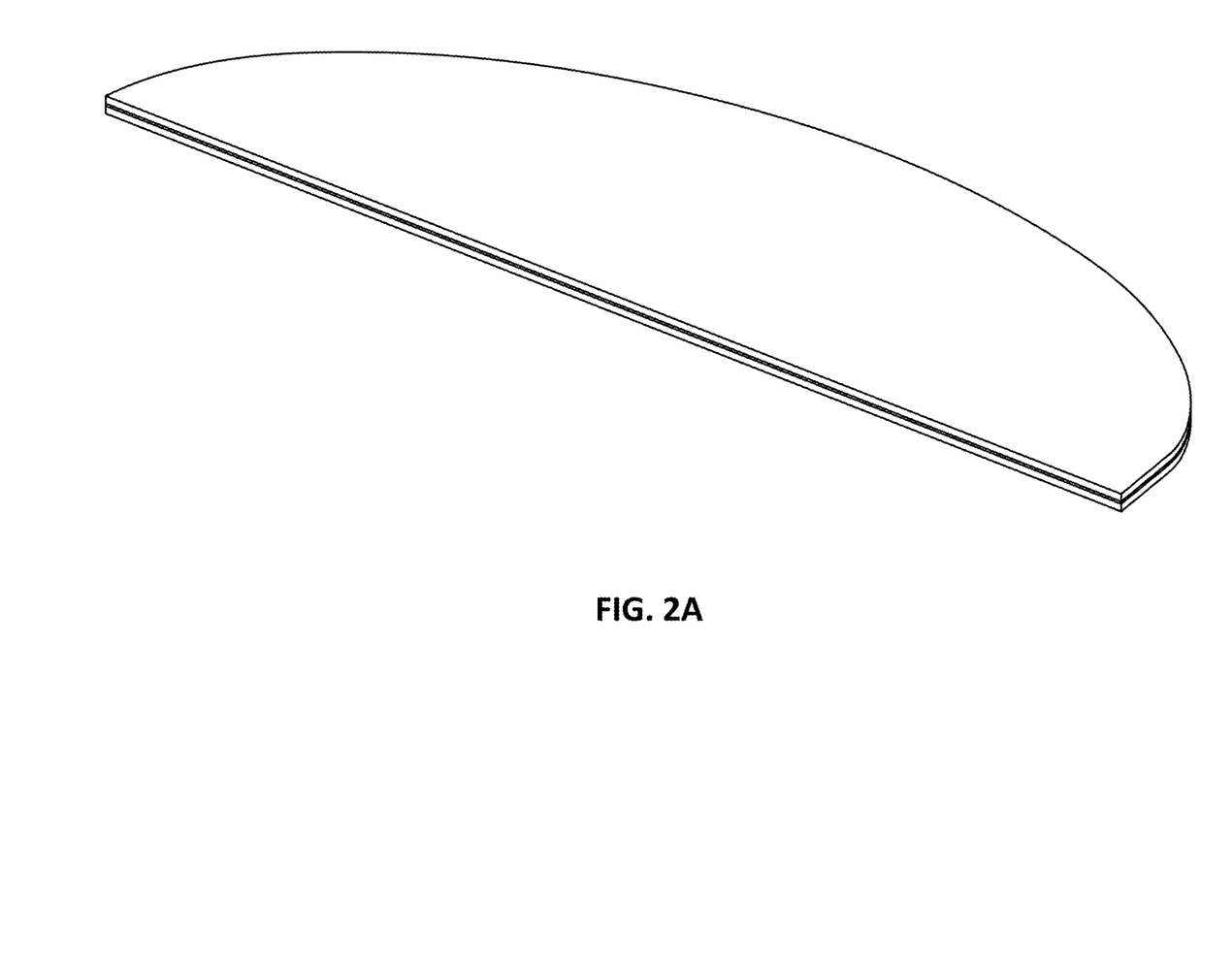
FIG. 2A illustrates cutaway view of a bonding of a lid wafer and circuit wafer.
Figure 2B:
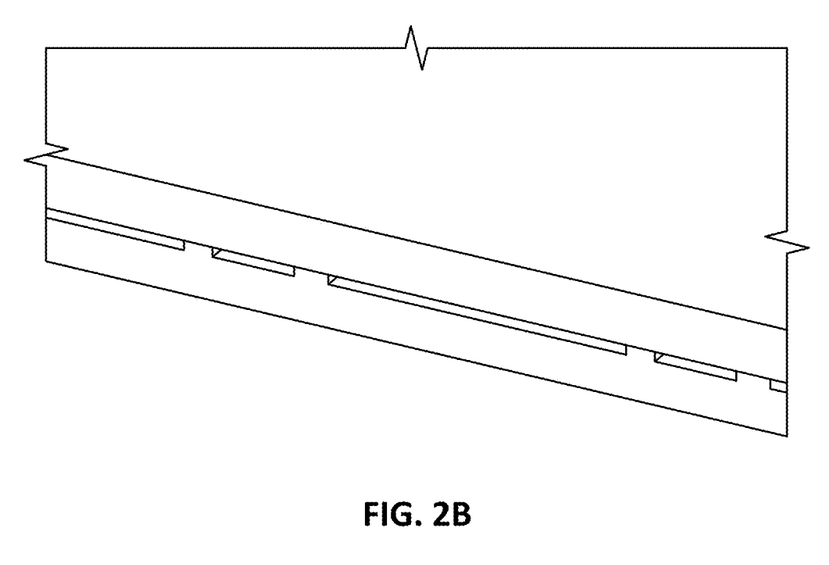
FIG. 2B illustrates a magnified portion of FIG. 2A.

FIG. 2A illustrates cutaway view of bonding of a lid wafer and circuit wafer. FIG. 2B illustrates a magnified portion of FIG. 2A.

Figure 11:
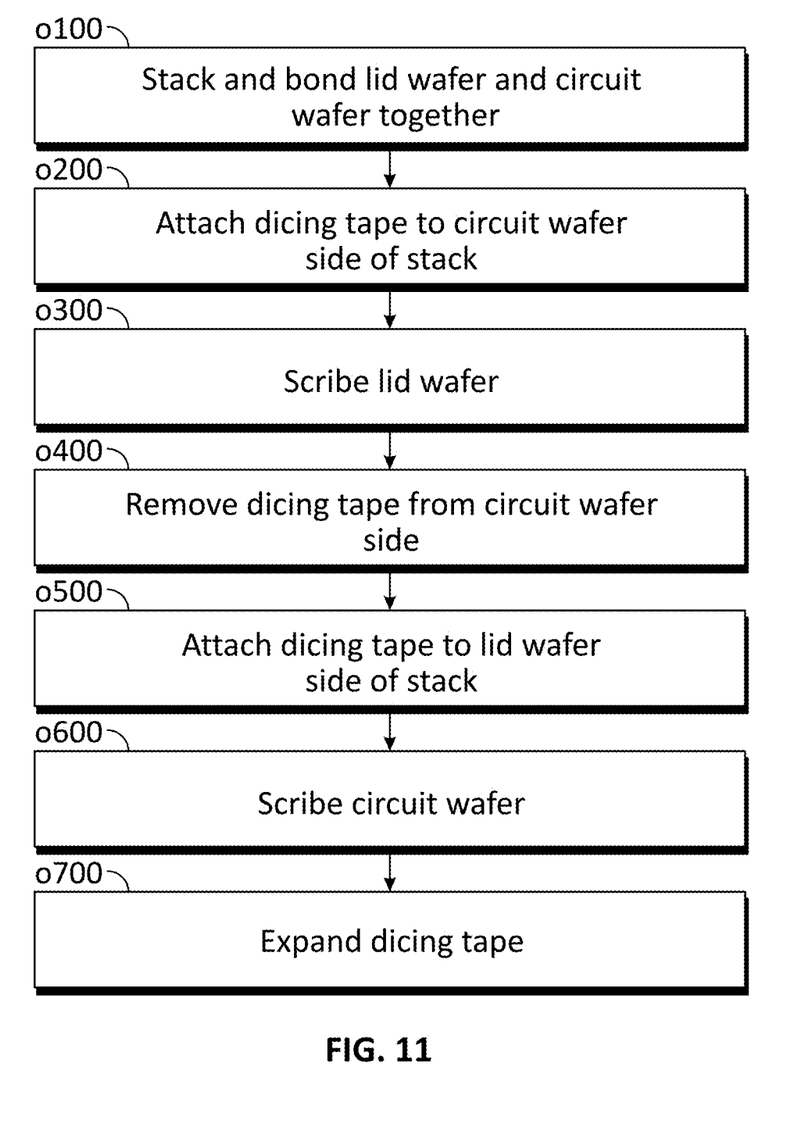
FIG. 11 illustrates a flowchart of a singulation process according to an embodiment.

Referring to FIGS. 2A and 2B, and operation o100 in FIG. 11, the lid wafer may be bonded to a circuit wafer. The circuit wafer may include a plurality of sensors. The circuit wafer may be, e.g., a microbolometer circuit wafer.

Figure 3A:
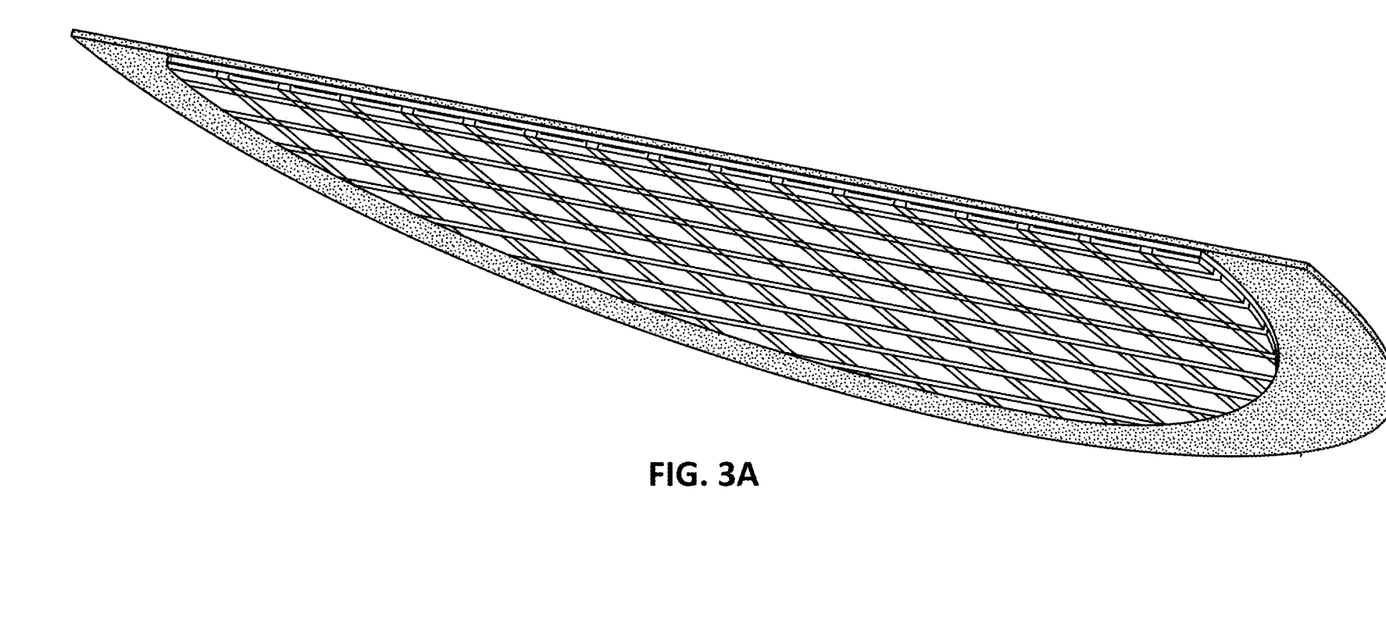
FIG. 3A illustrates a cutaway view of a dicing tape mounted on the circuit wafer and laser scribing of the lid wafer.
Figure 3B:
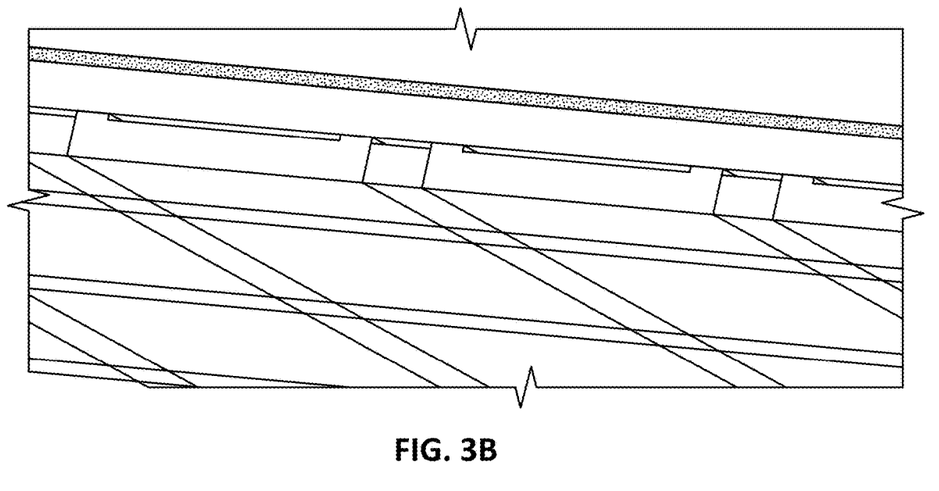
FIG. 3B illustrates a magnified portion of FIG. 3A.

FIG. 3A illustrates a cutaway view of a dicing tape mounted on the circuit wafer and laser scribing of the lid wafer. FIG. 3B illustrates a magnified portion of FIG. 3A.

Referring to FIGS. 3A and 3B, and operation o200 in FIG. 11, a dicing tape may be mounted on the circuit wafer of the stacked wafers. A laser scribing operation may be performed to scribe the lid wafer (operation o300 in FIG. 11). For example, the lid wafer may be a silicon wafer, and a laser may be focused inside the silicon wafer to scribe the wafer. The laser may be, e.g., a near IR wavelength laser. The laser scribing operation may be stealth laser scribing or stealth dicing. The stealth dicing may be performed using a method as described in U.S. Pat. No. 8,268,704, which is incorporated by reference herein. Scribe lines formed by stealth dicing may be cracks, which may later be expanded in a dicing tape expansion operation. In an implementation, laser scribing of the lid wafer scribes the lid wafer without scribing the circuit wafer.

Figure 4:
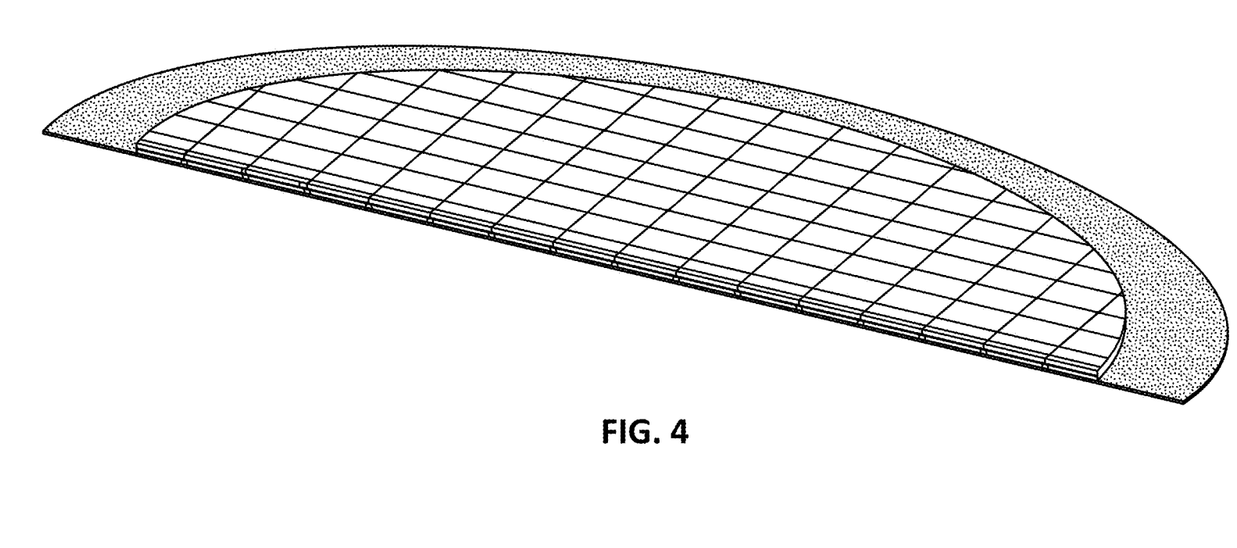
FIG. 4 illustrates a cutaway view of remounting a dicing tape on the scribed lid wafer and laser scribing of the circuit wafer.
Figure 5:
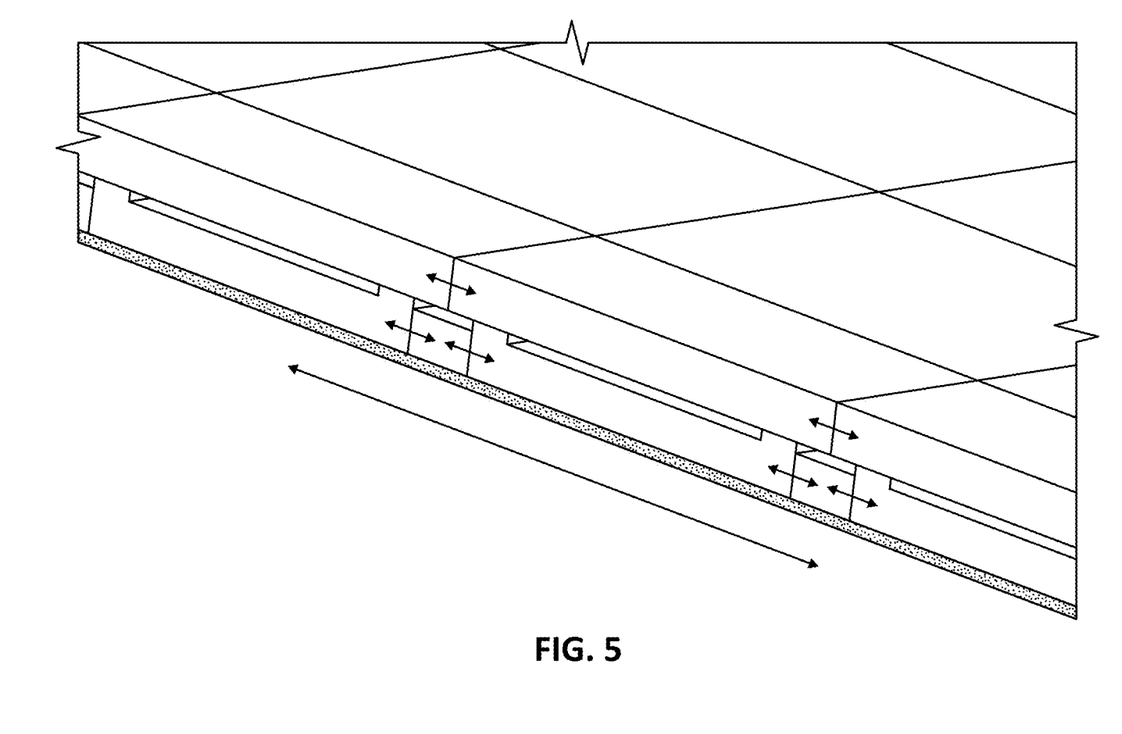
FIG. 5 illustrates a cutaway view of expansion of the dicing tape to separate dies.

FIG. 4 illustrates a cutaway view of remounting a dicing tape on the scribed lid wafer and laser scribing of the circuit wafer. FIG. 5 illustrates a cutaway view of expansion of the dicing tape to separate dies.

Referring to FIGS. 4 and 5, the dicing tape may be removed from the circuit wafer (operation o400 in FIG. 11) and dicing tape may be attached to the lid wafer (operation o500 in FIG. 11). A laser scribing operation may then be performed to scribe the circuit wafer (operation o600 in FIG. 11). The laser scribing operation on the circuit wafer. In the present example embodiment, as illustrated in greater detail in FIG. 5, the laser scribing operation on the circuit wafer is aligned with packages corresponding to the laser scribing operation on the lid wafer. In an implementation, laser scribing may consist of two aligned back-to-front laser scribes. In an implementation, laser scribing of the lid wafer scribes the lid wafer without scribing the circuit wafer. In an implementation, scribed lines on the lid wafer may be offset from scribed lines on the circuit wafer. For example, in the singulated package, the lid section of the lid wafer may have different length and/or width dimensions (in plan view) as compared to the corresponding circuit section of the circuit wafer. In an implementation, two passes of the laser scribe may be made on the lid side of the stack such that residual pieces of the lid wafer remain between the lid sections. In an implementation, the lid section of the singulated package may have a shorter length and/or width than the attached circuit section such that a surface of the circuit section facing in the lid direction may be exposed. The exposed surface of the circuit section may have bond pads thereon.

Following the laser scribing operation on the circuit wafer, the dicing tape on the lid wafer may be expanded (indicated by arrows in FIG. 5) (operation o700 in FIG. 11). A single expansion may be performed to simultaneously singulate both the lid and circuit substrates of WLP wafer stack, separating the WLP into individual packaged dies.

Figure 6:
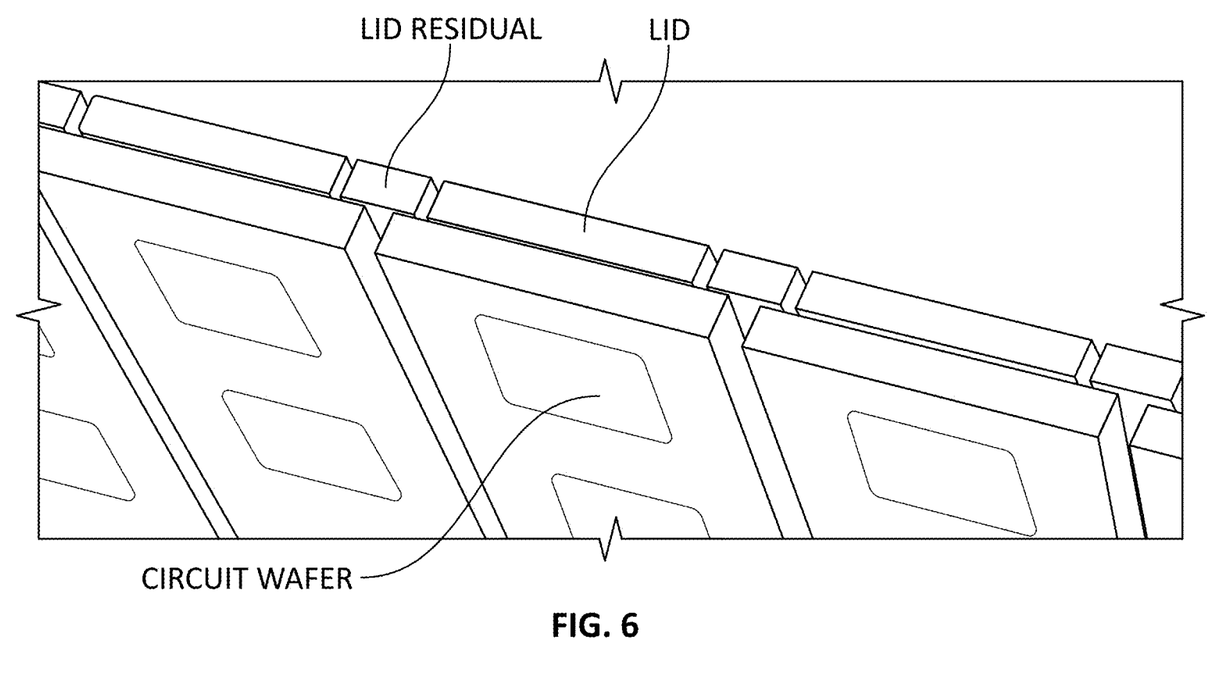
FIG. 6 illustrates a cutaway view of an example of an expanded WLP following singulation.
Figure 7A:
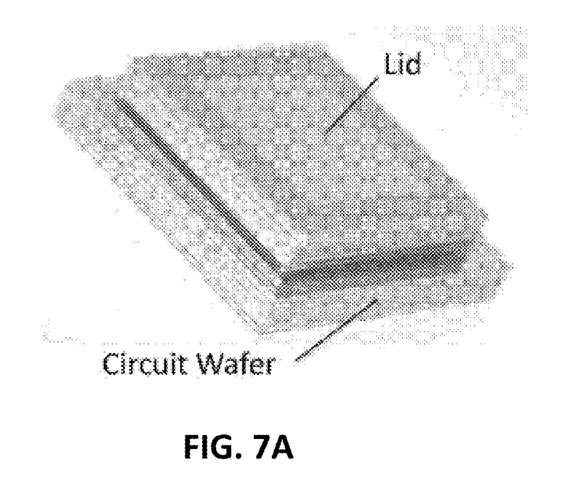
FIG. 7A illustrates a cutaway view of an example of an individual package following singulation.
Figure 7B:
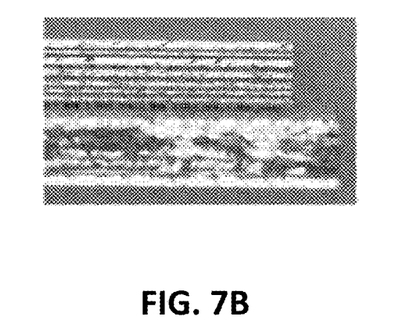
FIG. 7B illustrates ridges produced by a stealth dicing process.

FIG. 6 illustrates a cutaway view of an example of an expanded WLP following singulation. FIG. 7A illustrates a cutaway view of an example of an individual package following singulation.

Referring to FIG. 6, the lid section of the lid wafer is formed with a different width dimension as compared to the corresponding circuit section of the circuit wafer. Also, two passes of the laser scribe on the lid side of the stack form lid residual pieces between the lid sections. In the example shown in FIG. 7A, the lid wafer is formed with different length and width dimensions as compared to the corresponding circuit section of the circuit wafer As described above, a wafer stack of a WLP may be singulated into individual packaged dies without the use of a saw (dicing blade). The stealth dicing process may provide a die having an edge that shows lines or ridges in unique structure, the lines or ridges having a pitch related to the number of laser passes (see the laterally extending ridges in FIGS. 7A and 7B). These lines or ridges are detectable and easily distinguishable from, e.g., Bosch etch scallops or ground surface finish created by saw dicing.

According to another example embodiment, an individual packaged die may have a lid (or cap) having one or more relieved walls. In an implementation, one or more walls of the lid may be relieved by forming the wall at an angle or taper, such that the wall slopes toward the center of the package, away from the exposed bond pads.

In an example embodiment, a lid pattern in a lid wafer for a WLP may be formed such that one or more sidewalls of each of the respective lids in the lid pattern is angled relative to major surfaces of the lid wafer.

In an implementation, a beveled dicing blade (or beveled kerf saw) may be used to form a lid pattern in which one or more sidewalls of each of the respective lids is angled.

Figure 8:
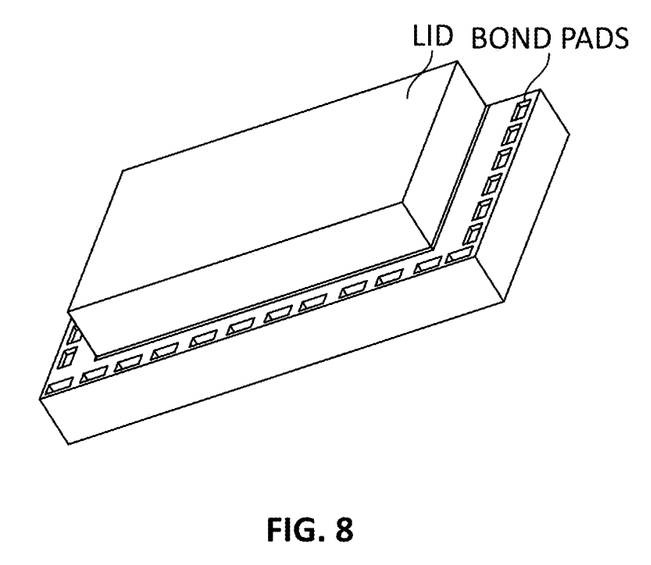
FIG. 8 illustrates a singulated package having a lid with straight edges.
Figure 9:
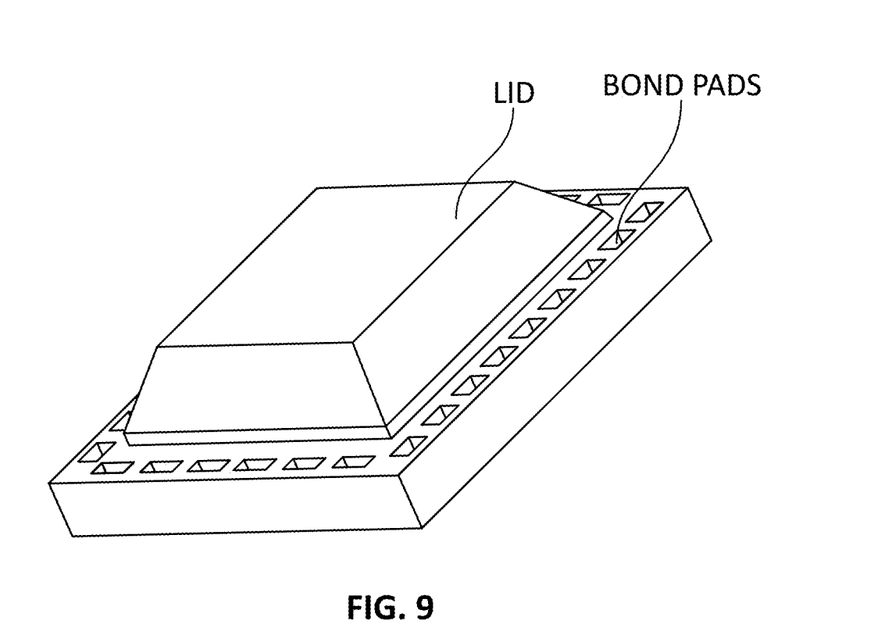
FIG. 9 illustrates a singulated package having a lid with relieved edges.

FIG. 8 illustrates a singulated package having a lid with straight edges. FIG. 9 illustrates a singulated package having a lid with relieved edges.

The package illustrated in FIG. 8 has a lid with straight edges, i.e., edges that are vertical to or normal to the major surface of the circuit die. The size of the lid is smaller than the corresponding circuit die such that the bond pads are exposed by the lid. When capillary bonding is used to connect the bond pads, the size of the lid is reduced in order to provide an exposed bond pad area sufficient for the capillary bonding operation. Thus, this structure may have a substantial space or margin between the bond pads and the edge of the cap in order to provide free access of the wire bonding capillary.

The package illustrated in FIG. 9 has a lid with relieved edges, here, angled edges such that the lid has a pyramidal shape. The angled edges may provide sufficient relief at the top of the lid for the capillary bonding operation to take place, while at the same time covering more of the circuit die. The angle (as determined relative to the exposed surface of the circuit wafer) may be greater than 0 and less than 90 degrees, e.g., about 15 degrees, about 30 degrees, about 45 degrees, or about 60 degrees. In the package in which the lid edges are relieved, the area of the circuit die enclosed by the lid may be larger, relative to the straight-walled package (having 90 degree walls relative to the exposed surface of the circuit wafer) illustrated in FIG. 8. The circuit die exposed beyond the lid may form a planar area on at least one side of the lid. For example, a planar area of the circuit die may be exposed on four sides of a pyramidal lid.

In an embodiment, the package illustrated in FIG. 9 may be formed using a beveled dicing blade on the lid wafer of a wafer stack in a WLP, such that the bevel of the dicing blade forms the angled edges of the lid.

As described above, a singulated package may have a lid with tapered walls. The walls may have a taper angle that is larger than the one of the wire bonding capillary. The tapered walls may allow for reducing the spatial margin between the bond pads and the edge of the cap provided for wirebonding.

Figure 10:
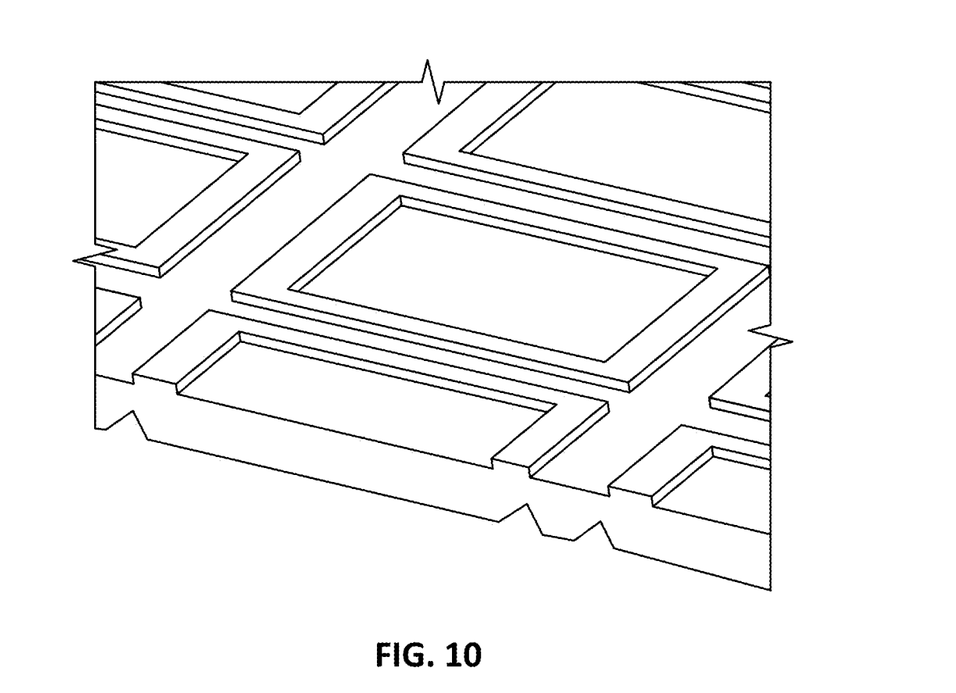
FIG. 10 illustrates an enlarged cutaway view of a lid wafer with an etched lids pattern and beveled kerfs.

FIG. 10 illustrates an enlarged cutaway view of a lid wafer with an etched lids pattern and beveled kerfs.

In an implementation, stealth dicing as described above in connection with FIGS. 1A-7 may be combined with the use of a beveled dicing blade as described above in connection with FIG. 9. For example, referring to FIG. 10, the beveled dicing blade may be used to partially form the lid sidewalls, i.e., form an angled region of the lid sidewalls. Subsequently, stealth dicing may be used to singulate the packages from the WLP, the stealth dicing of the lid wafer forming the remaining portion of the lid sidewalls.

Figure 12:
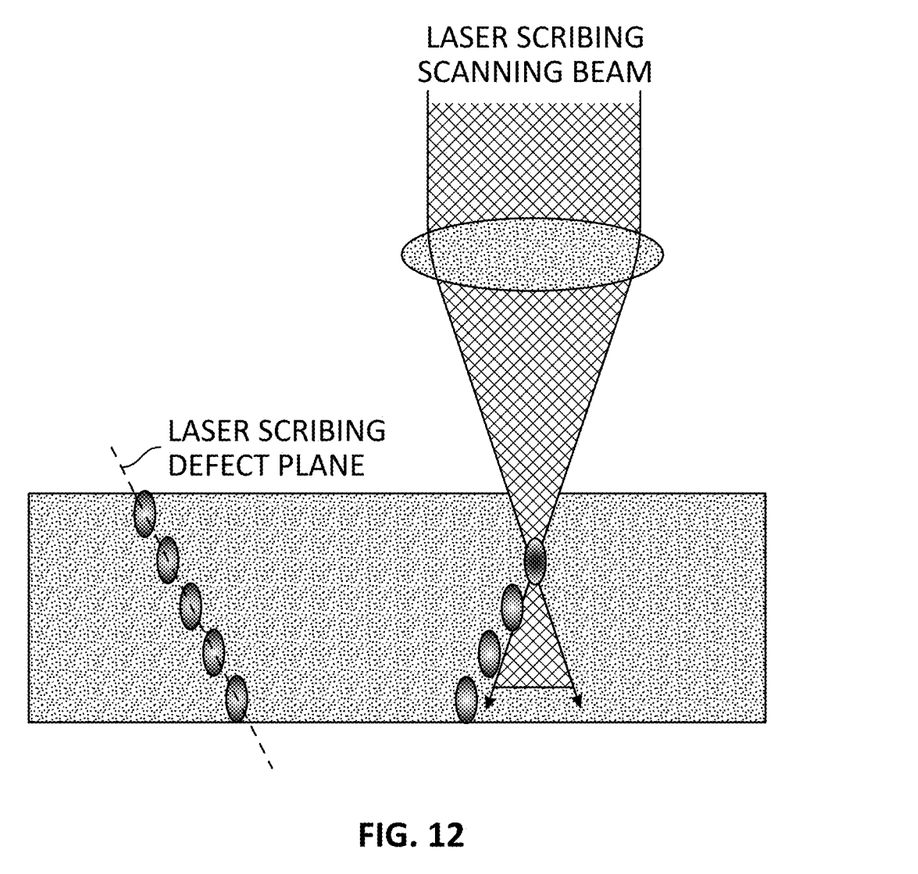
FIG. 12 illustrates stealth dicing to induce defects along an angled plane.

Further, to eliminate the requirement for a beveled dicing blade, the lid sidewall can be angled by re-programming the stealth dicing system to locate the laser-induced defects along an angled plane within the silicon, as shown in FIG. 12. This manner of stealth dicing angled planes within the silicon is may be used to singulate the lid wafer in a single process step while providing adequate space for wirebonding.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of singulating, comprising:
   scribing a first scribe line on a first side of a substrate;
   scribing a second scribe line on a second side of the substrate, the first and second sides facing away from each other, the second scribe line being substantially parallel to the first scribe line; and
   simultaneously separating the substrate at the first scribe line and the second scribe line, wherein separating the substrate at the first scribe line and the second scribe line provides a singulated die having an angled sidewall in which an edge of the singulated die forms an angle greater than 0 degrees and less than 90 degrees with a face of the singulated die.

2. The method as claimed in claim 1, wherein scribing uses a laser irradiated on the substrate in a stealth dicing operation.

3. The method as claimed in claim 1, wherein the substrate includes first and second substrates in a stacked arrangement, the first scribe line being formed in the first substrate, and the second scribe line being formed in the second substrate.

4. The method as claimed in claim 3, wherein the first and second scribe lines are offset from one another.

5. The method of claim 3, wherein the first substrate has a bond pad area that includes at least one bond pad on a side facing the second substrate, wherein the bond pad area is not covered by the second substrate, and the angled sidewall is a sidewall of the second substrate, the angled sidewall being angled to reduce the second substrate's area facing away from the first substrate relative to the second substrate's area facing the first substrate.

6. The method as claimed in claim 3, wherein the first scribe line does not separate the second substrate.

7. The method as claimed in claim 3, wherein the first substrate includes at least one circuit structure, and the second substrate forms a lid for the at least one circuit structure.

8. The method as claimed in claim 3, further comprising attaching a dicing tape to the first substrate, the dicing tape being expanded after the second scribe line is formed.

9. The device package manufactured according to the method as claimed in claim 3, wherein:
   the first substrate comprises a device, the first substrate having a bond pad area that includes at least one bond pad; and
   the second substrate comprises a lid attached to the first substrate, the lid covering the device, the lid exposing the bond pad area, the lid having said angled sidewall extending at an angle to the first substrate, the angle being greater than 0 and less than 90 degrees.

10. The device package of claim 9, wherein the lid has a pyramidal shape.

11. The method of claim 3, the method comprising, before scribing the first and second scribe lines:
   providing the first substrate comprising a first wafer having a plurality of devices;
   providing the second substrate comprising a second wafer having a lid pattern delineating a plurality of lids; and
   attaching the first and second wafers together such that the lids cover the devices;

wherein the scribing of the second scribe line forms the angled sidewall as a surface of the lids, the angled sidewall being at an angle relative to a major surface of the second wafer, the angle being greater than 0 and less than 90 degrees.

12. A device manufactured according to the method as claimed in claim 11.

13. A method of singulating, comprising:
scribing a first scribe line on a first side of a substrate;
scribing a second scribe line on a second side of the substrate, the first and second sides facing away from each other, the second scribe line being substantially parallel to the first scribe line;
simultaneously separating the substrate at the first scribe line and the second scribe line;
wherein the substrate includes first and second substrates in a stacked arrangement, the first scribe line being formed in the first substrate, and the second scribe line being formed in the second substrate; and
scribing a third scribe line on the second side of the substrate, the third scribe line being substantially parallel to the first scribe line, the second and third scribe lines being spaced apart, wherein the second and third scribe lines form edges of a portion of the second substrate that is not attached to the first substrate.

14. A device package manufactured according to the method as claimed in claim 13.

15. The method of claim 13, wherein:
the first substrate comprises a plurality of devices, and the first scribe line is scribed between the devices;
the second substrate comprises a plurality of lids, and said portion of the second substrate is between the lids.

16. The method of claim 13, wherein the first substrate comprises bond pads, and said portion of the second substrate is removed to expose the bond pads.

17. A device package fabricated from a substrate having a plurality of devices and singulated according to a method of singulating, the method comprising:
scribing a first scribe line on a first side of a substrate;
scribing a second scribe line on a second side of the substrate, the first and second sides facing away from each other, the second scribe line being substantially parallel to the first scribe line; and
simultaneously separating the substrate at the first scribe line and the second scribe line;
wherein the device package includes a circuit die section and a lid die section, and at least one side surface of the circuit die section and at least one side surface of the lid die section have ridges extending in a longitudinal direction.

18. The device package of claim 17, wherein:
the first substrate comprises a first wafer having a plurality of devices;
the second substrate comprises a second wafer having a lid pattern delineating a plurality of lids;
scribing the second scribe line comprises removing portions of a surface of the second wafer corresponding to lid edges in the lid pattern using a beveled dicing blade such that the lids have at least one sidewall that is at an angle relative to the second substrate, the angle being greater than 0 and less than 90 degrees, wherein, during removal of the portions of the surface of the second wafer corresponding to the lid edges, the dicing blade does not completely penetrate the second substrate; and
the method further comprises attaching the first and second wafers together such that the lids cover the devices.

19. A device package fabricated from a substrate having a plurality of devices and singulated according to the method as claimed in claim 1, wherein the device package includes a circuit die section and a lid die section; and wherein the circuit die section has a bond pad area that includes at least one bond pad on the circuit die section's side facing the lid die section, the lid die section not covering the bond pad area.

20. The device package of claim 19, wherein the angled sidewall is part of the lid die section, and the angled sidewall slopes away from the bond pad area to provide relief for access to the bond pad area from the second side of the substrate.

* * * * *